(12) United States Patent
Maruyama

(10) Patent No.: US 11,128,257 B1
(45) Date of Patent: Sep. 21, 2021

(54) SEMICONDUCTOR DEVICE, DIGITALLY CONTROLLED OSCILLATOR, AND CONTROL METHOD OF SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Tatsuhiko Maruyama, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/007,286

(22) Filed: Aug. 31, 2020

(30) Foreign Application Priority Data

Mar. 23, 2020 (JP) .............................. JP2020-051592

(51) Int. Cl.
*H03B 5/12* (2006.01)

(52) U.S. Cl.
CPC ..... *H03B 5/1228* (2013.01); *H03B 2200/004* (2013.01)

(58) Field of Classification Search
CPC .......................... H03B 5/1228; H03B 2200/004
USPC ....................... 331/167, 117 FE, 36 C, 177 V
See application file for complete search history.

(56) References Cited

U.S. PATENT DOCUMENTS 8,125,285 B2 * 2/2012 Titus ........................ H03L 7/093
331/177 V 8,841,975 B2  9/2014 Nakamura
9,391,622 B2  7/2016 Tamura et al.
2012/0139654 A1  6/2012 Ohara et al.

FOREIGN PATENT DOCUMENTS

JP    2013-89997 A    5/2013
JP    2015-149694 A   8/2015
WO    2011-161860 A1  12/2011

OTHER PUBLICATIONS

Y. Itano, et al., "High-Q MOS Varactor Models for Quasi-Millimeter-Wave Low-Noise LC-VCOs," IEICE Transaction Fundamentals, vol. E97-A, No. 3, pp. 759-767, Mar. 2014.
N. Itoh, "A Study of Capacitor-Coupled Varactor VCO to Investigate Flicker Noise Up-Conversion Mechanism," Proc. of RFIT2005, Singapore, pp. 157-160, Dec. 2005.
D. Miyashita, et al., "A Phase Noise Minimization of CMOS VCOs over Wide Tuning Range and Large PVT Variations," IEEE 2005 Custom Integrated Circuits Conference, p. 583-586.
N. Itoh, et al., "1200 MHz fully integrated VCO with "turbo-charger" technique," 2001 ESSCIRC, pp. 1-4.

* cited by examiner

*Primary Examiner* — Arnold M Kinkead
(74) *Attorney, Agent, or Firm* — White & Case LLP

(57) ABSTRACT

A semiconductor device according to the present embodiment includes a plurality of switching elements and a plurality of variable capacitance elements. The switching elements are switching elements connected in series between a first control terminal and a second control terminal and plural types of capacitance control signals can be supplied to the first control terminal and the second control terminal. The variable capacitance elements have capacitance control terminals connected to corresponding one ends of the switching elements, respectively.

15 Claims, 9 Drawing Sheets

SEMICONDUCTOR DEVICE, DIGITALLY CONTROLLED OSCILLATOR, AND CONTROL METHOD OF SEMICONDUCTOR DEVICE

CROSS-REFERENCE TO RELATED APPLICATIONS

This application is based upon and claims the benefit of priority from the prior Japanese Patent Application No. 2020-051592, filed on Mar. 23, 2020, the entire contents of which are incorporated herein by reference.

FIELD

Embodiments of the present invention relate to a semiconductor device, a digitally controlled oscillator, and a control method of a semiconductor device.

BACKGROUND

A digitally controlled oscillator includes an inductor and a plurality of variable capacitance elements connected in parallel and is generally configured as an LC oscillation circuit. The digitally controlled oscillator is oscillated at a predetermined frequency by controlling each of the variable capacitance elements to either a high capacitance value or a low capacitance value using a digital control signal.

In order to widen the oscillation frequency range in the digital controlled oscillator while keeping a frequency change with respect to a unit control signal small and constant, it is necessary to increase the number of control bits and also increase the number of variable capacitance elements. However, increases in the number of control bits and the number of variable capacitance elements increase the occupation area of control lines respectively controlling the variable capacitance elements and the parasitic capacitance of the control lines is also increased.

DETAILED DESCRIPTION

Figure 1:
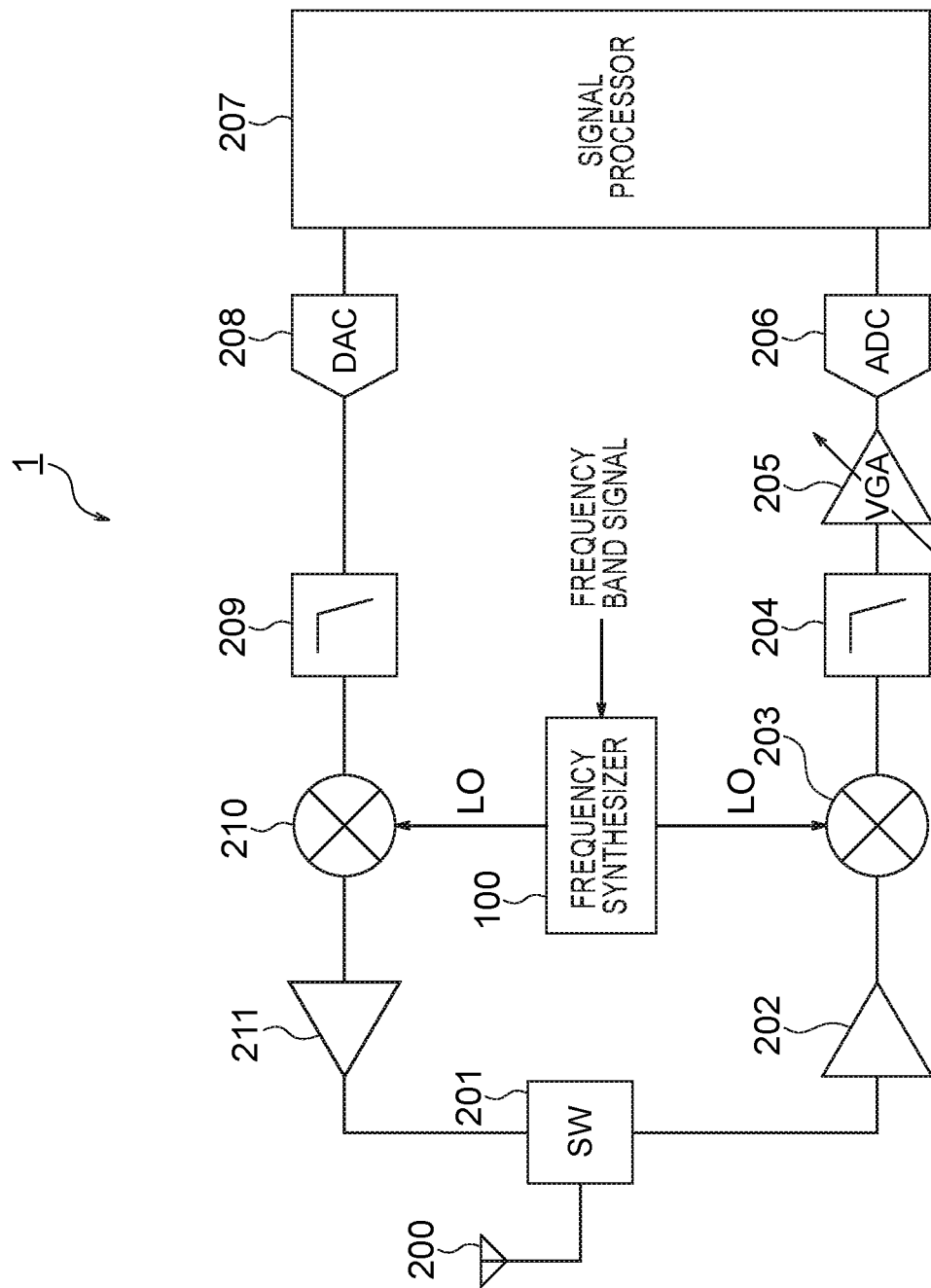
FIG. 1 is a block diagram of a wireless communication device.

A semiconductor device, a digitally controlled oscillator, a frequency synthesizer, and a control method of a semiconductor device according to embodiments of the present invention will now be explained in detail with reference to the accompanying drawings. The embodiments described below are only examples of the embodiments of the present invention and it is not to be understood that the present invention is limited to these embodiments. In the drawings referred to in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

FIG. 1 is a block diagram of a wireless communication device 1. As illustrated in FIG. 1, the wireless communication device 1 includes a frequency synthesizer 100, an antenna 200, a switch 201, a low noise amplifier 202, a mixer 203, a filter 204, a variable gain amplifier (VGA) 205, an analog/digital (A/D) converter 206, a signal processor 207, a digital/analog (D/A) converter 208, a filter 209, a mixer 210, and a power amplifier 211.

The frequency synthesizer 100 generates, for example, a local signal LO on the basis of a frequency band signal. Details of the frequency synthesizer 100 are described later with reference to FIG. 2.

The antenna 200 receives a reception signal of a radio frequency and transmits a transmission signal of the radio frequency. The switch 201 supplies the reception signal received by the antenna 200 to the low noise amplifier 202 at the time of reception. The low noise amplifier 202 amplifies the reception signal supplied from the switch 201 with low noise. The mixer 203 performs frequency conversion of an output signal from the low noise amplifier 202 with the local signal LO to cause the frequency to be lower than that of the reception signal. The filter 204 band-limits an output signal from the mixer 203. The variable gain amplifier 205 amplifies an output signal from the filter 204. The gain of the variable gain amplifier 205 is variable and is adjusted to keep the amplitude of an output signal of the variable gain amplifier 205 substantially constant. The A/D converter 206 converts an output signal from the variable gain amplifier 205 into a digital signal. The signal processor 207 performs signal processing of the digital signal supplied from the A/D converter 206 to obtain reception data.

The signal processor 207 outputs a digital signal obtained by signal processing of transmission data. The D/A converter 208 converts the digital signal output from the signal processor 207 into an analog signal. The filter 209 band-limits the analog signal output from the D/A converter 208. The mixer 210 performs frequency conversion of an output signal from the filter 209 with the local signal LO to output a signal of the radio frequency. The power amplifier 211 supplies a transmission signal obtained by power amplification of an output signal from the mixer 210 to the switch 201. The switch 201 supplies the transmission signal supplied from the power amplifier 211 to the antenna 200 at the time of transmission.

A detailed configuration of the frequency synthesizer 100 is explained below with reference to FIG. 2.

Figure 2:
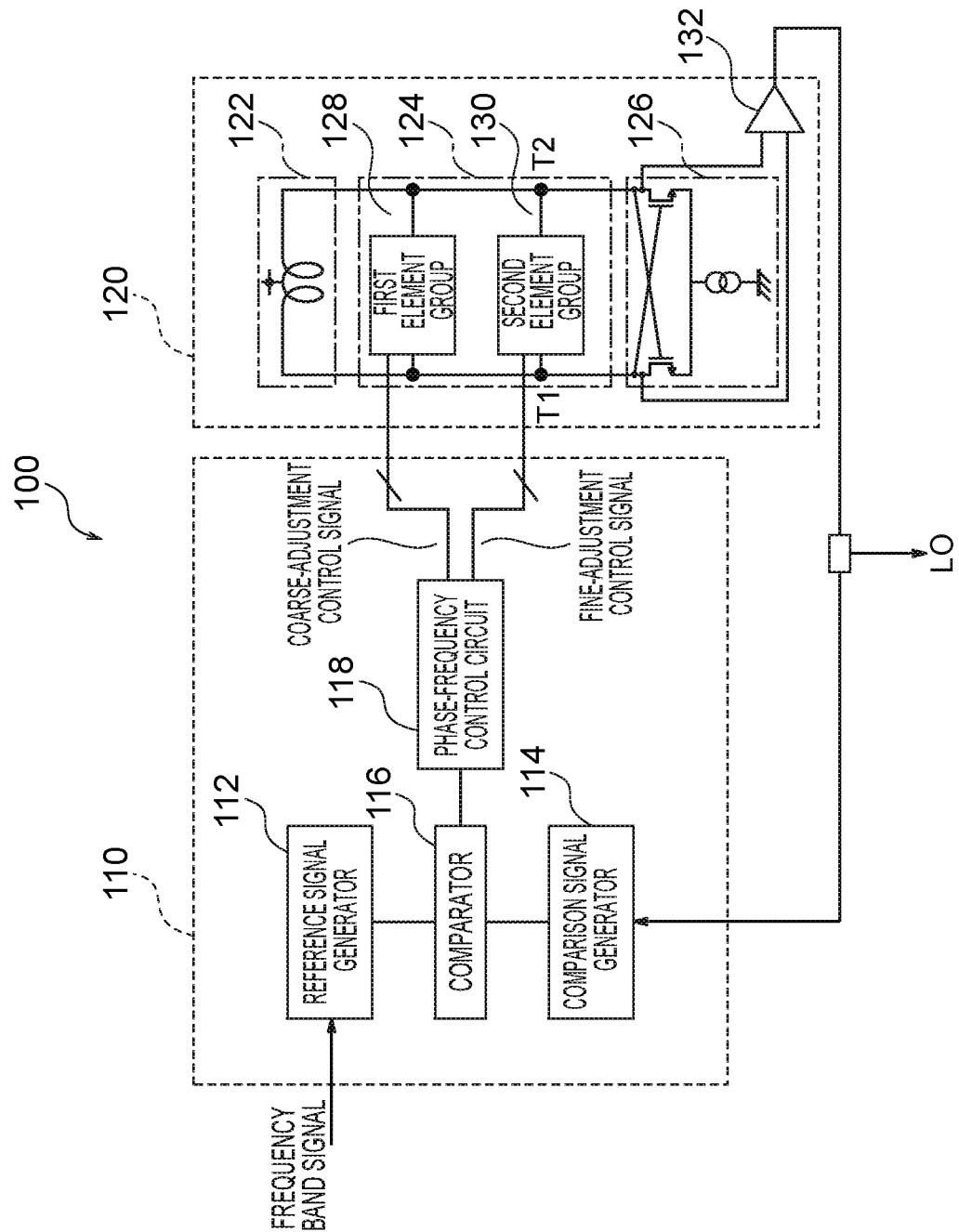
FIG. 2 is a block diagram illustrating a configuration of a frequency synthesizer.

FIG. 2 is a block diagram illustrating a configuration of the frequency synthesizer 100 according to the present embodiment. The frequency synthesizer 100 according to the present embodiment includes a control circuit 110 and a digitally controlled oscillator 120. For example, the frequency synthesizer 100 is a phase-locked loop (PLL) circuit that executes loop control of the oscillation frequency of the digitally controlled oscillator 120 using the control circuit 110.

The control circuit 110 includes a reference signal generator 112, a comparison signal generator 114, a comparator 116, and a phase-frequency control circuit 118. The digitally controlled oscillator 120 is configured as an LC oscillation circuit including an inductor 122, a variable capacitance part 124, a negative resistance generator 126, and an output amplifier 132.

The digitally controlled oscillator 120 can change the oscillation frequency of the digitally controlled oscillator 120 by changing the capacitance value of the variable capacitance part 124. The variable capacitance part 12 includes a first element group 128 and a second element group 130. The variable capacitance part 124 is, for example, a semiconductor device placed on an SOI (Silicon On Insulator) substrate.

The first element group 128 is a variable capacitor for coarse adjustment and is used to coarsely determine the oscillation frequency of the digitally controlled oscillator 120. Meanwhile, the second element group 130 is a variable capacitor for fine adjustment and is used to finely adjust the oscillation frequency of the digitally controlled oscillator 120. A frequency change with respect to a unit control signal in the digitally controlled oscillator 120 corresponds to a change of the unit capacitance of the second element group 130. For example, the second element group 130 can change the total capacitance in 1024 stages in a stepwise manner. In the present embodiment, the change amount of the total capacitance of the second element group 130, which is discretely changed in a change of one stage, is referred to as "unit capacitance". The number of stages in which the total capacitance of the second element group 130 can be discretely changed is referred to as "the number of control bits". That is, the number of control bits of the second element group 130 is, for example, 1024. Details of the second element group 130 are described later.

In the control circuit 110, the reference signal generator 112 generates, for example, a reference signal REF on the basis of a frequency band signal. For example, the frequency band signal complies with Bluetooth (registered trademark).

Figure 3:
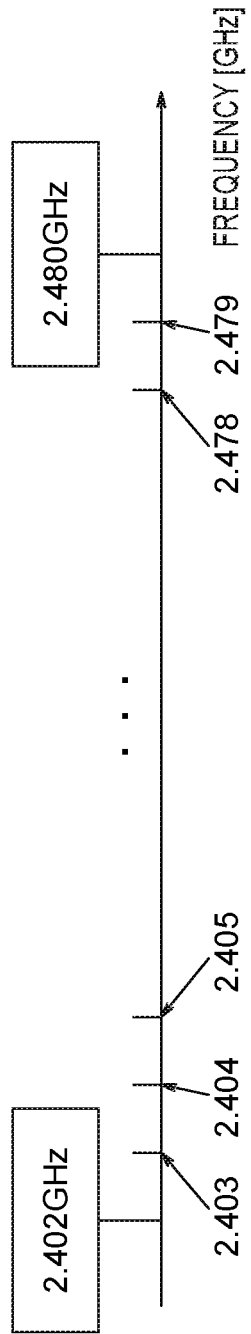
FIG. 3 is a band diagram illustrating a frequency band that can be used by the frequency synthesizer.

FIG. 3 is a band diagram illustrating a frequency band that can be used by the frequency synthesizer 100 according to the present embodiment. As illustrated in FIG. 3, the frequency band used between a master 1 and slaves 2 and 3 according to the present embodiment is a 2.4-[GHz] band predetermined in the Bluetooth standard. Specifically, frequencies from 2.402 [GHz] to 2.480 [GHz] are divided into 79. That is, communication is performed using any of frequencies 2.402 [GHz], 2.403 [GHz], 2.404 [GHz], . . . , and 2.480 [GHz].

Figure 4:
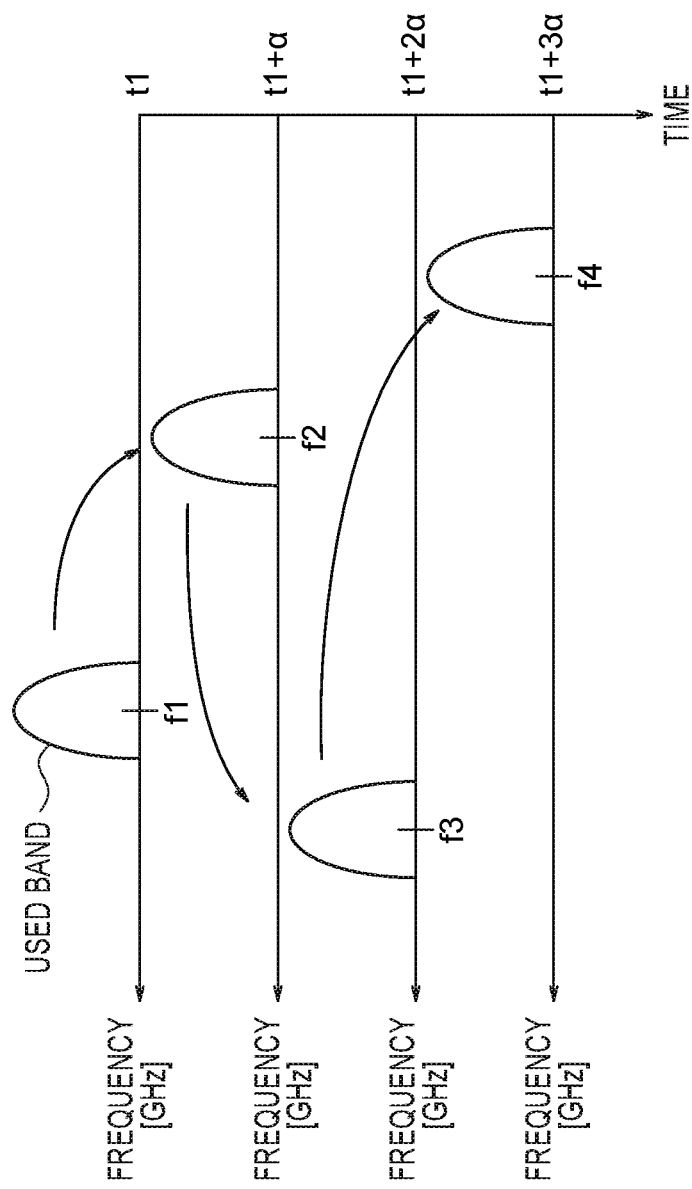
FIG. 4 is a conceptual diagram of a frequency-hopping spread spectrum system in communication compliant with the Bluetooth standard.

FIG. 4 is a conceptual diagram of a frequency-hopping spread spectrum system in communication compliant with the Bluetooth standard and illustrates a relation between progresses of the time on the vertical axis and frequencies to be used at the times on the horizontal axis. FIG. 4 illustrates a manner in which the frequency band used by the frequency synthesizer 100 is changed (hopped) for each time. In the communication compliant with the Bluetooth standard, the frequency to be used is changed 1600 times per second. Therefore, the time period in which data is transferred while the frequency is kept constant is 625 [βsec]. That is, a value a illustrated in FIG. 4 is 625 [βsec]. Each section of 625 [βsec] is referred to as "one slot".

Referring back to FIG. 2, the comparison signal generator 114 generates a comparison signal by performing processing such as frequency division and integration to the output LO of the digitally controlled oscillator 120. The comparator 116 receives the comparison signal and the reference signal REF and compares the phases or frequencies of these signals or both the phases and frequencies with each other to output a comparison result according to a deviation therebetween.

The phase-frequency control circuit 118 adjusts the capacitance value of the variable capacitance part 124 on the basis of the comparison result of the comparator 116. More specifically, the phase-frequency control circuit 118 sets the capacitance value of the variable capacitance part 124 in order to decrease the frequency when the phase of the digitally controlled oscillator 120 leads. On the other hand, when the phase of the digitally controlled oscillator 120 lags, the phase-frequency control circuit 118 sets the capacitance value to increase the frequency. That is, the phase-frequency control circuit 118 generates a coarse-adjustment control signal controlling the first element group 128 and a fine-adjustment control signal controlling the second element group 130 and sets the capacitance value of the capacitance part 124, thereby enabling the digitally controlled oscillator 120 to be finally oscillated at a desired oscillation frequency. The fine-adjustment control signal includes information of the number of control bits of the second element group 130 for the oscillation frequency. That is, the fine-adjustment control signal has information of the total capacitance of the second element group 130.

In this way, the coarse-adjustment control signal coarsely determines the oscillation frequency of the digitally controlled oscillator 120 and the fine-adjustment control signal causes the oscillation frequency of the digitally controlled oscillator 120 to follow a target value. This enables the frequency synthesizer 100 to stably supply a desired oscillation frequency signal. Details of the fine-adjustment control signal are also described later.

A detailed configuration of the second element group 130 is explained below based on FIGS. 5 and 6.

Figure 5:
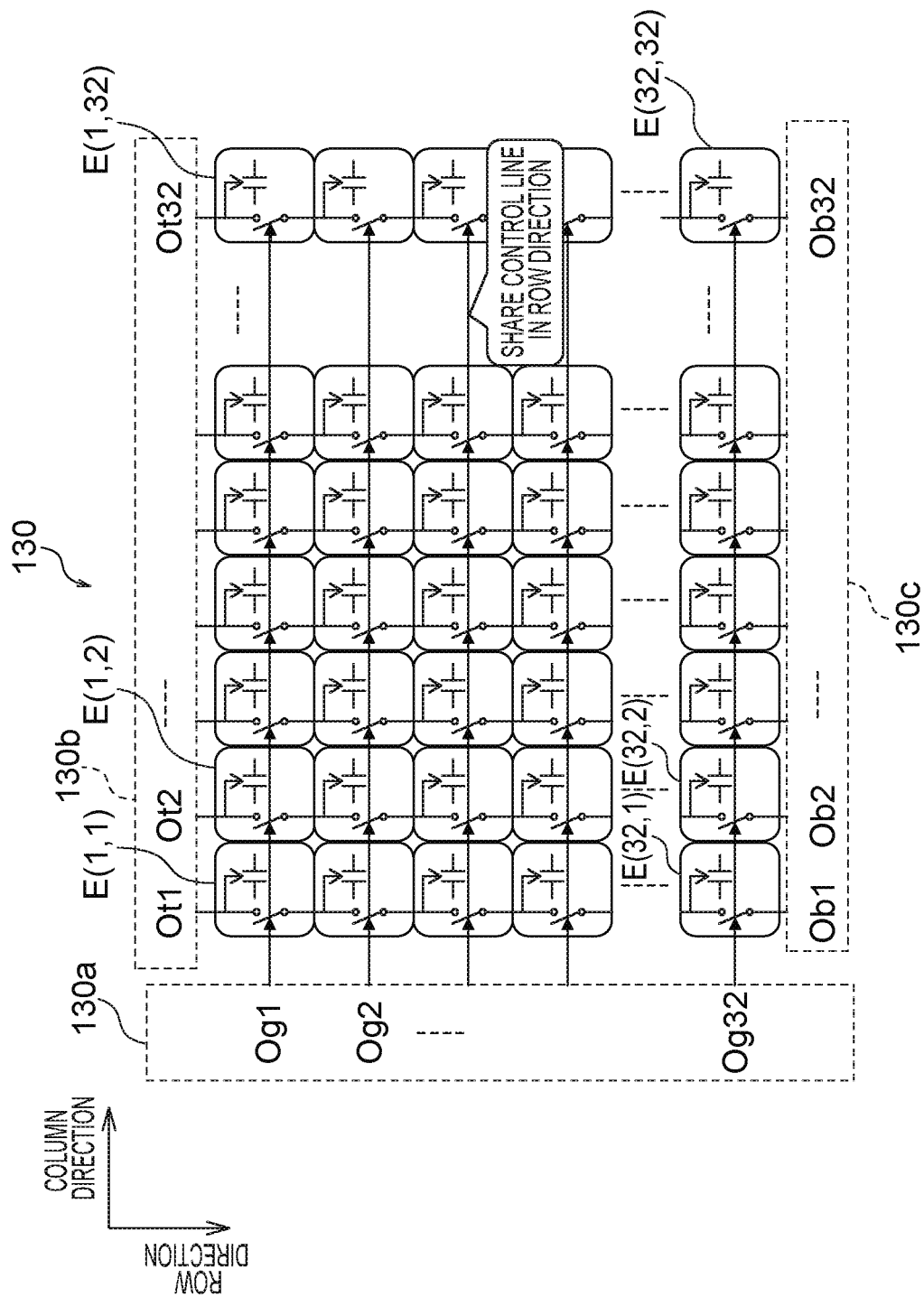
FIG. 5 is a diagram illustrating a configuration example of a second element group.

FIG. 5 is a diagram illustrating a configuration example of the second element group 130. As illustrated in FIG. 5, the second element group 130 has 32×32 elements E(1,1) to E(32,32). These 32×32 elements E(1,1) to E(32,32) are placed in a two-dimensional matrix. It is assumed here that an nth row and an mth column is represented as (n,m). For example, n and m are integers not less than 1 and not more than 32. Accordingly, for example, an element E(12,15) indicates an element placed in the 12th row and the 15th column. The second element group 130 also includes control terminals 130a arranged in a column, top control terminals 130b arranged in a row, and bottom control terminals 130c arranged in a row. While the number of elements E is assumed to be 32×32 in the present embodiment to simplify the explanations, the number is not limited thereto.

Figure 6:
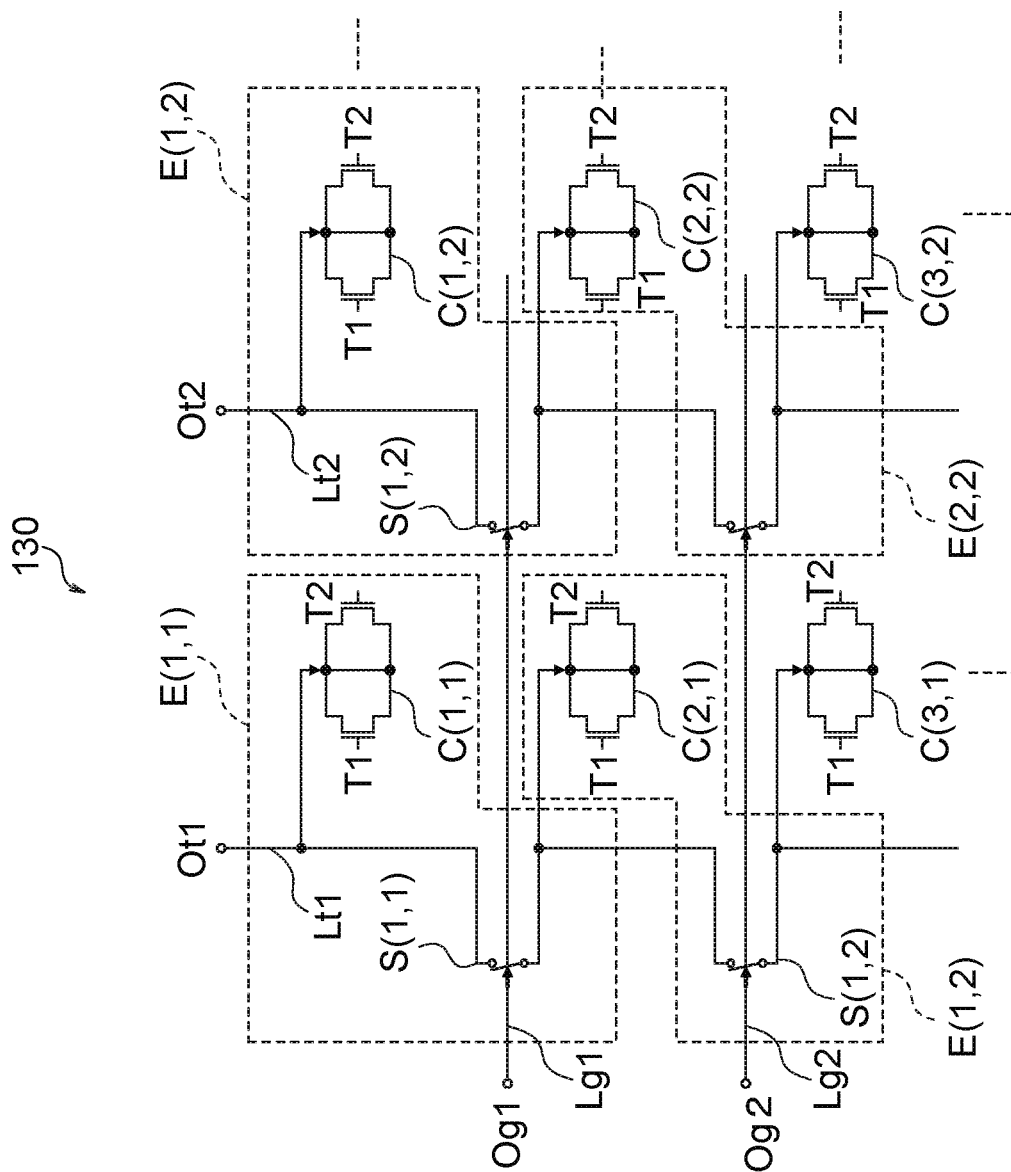
FIG. 6 is a diagram illustrating some of capacitance elements in detail.

The detailed configuration of the second element group 130 is explained based on FIG. 6 while referring to FIG. 5. FIG. 6 is a diagram illustrating some of the capacitance elements E(1,1) to E(32,32) in FIG. 5 in detail. As illustrated in FIG. 6, the capacitance elements E(1,1) to E(32,32) include variable capacitance elements C(1,1) to C(32,32), and switching elements S(1,1) to S(32,32), respectively. The variable capacitance elements C(1,1) to C(32,32) change the capacitances between a first capacitance and a second capacitance smaller than the first capacitance in response to plural types of capacitance control signals supplied to capacitance control terminals, respectively. More specifically, each of the variable capacitance elements C(1,1) to C(32,32) has the first capacitance when a first capacitance signal is supplied to the capacitance control terminal and has the second capacitance when a second capacitance signal is supplied to the capacitance control terminal.

Each of the variable capacitance elements C(1,1) to C(32,32) is, for example, a capacitor including gate capacitances of two NMOS (N-channel Metal Oxide Semiconductor) transistors. That is, each of the variable capacitance elements C(1,1) to C(32,32) has, for example, two NMOS transistors connected in parallel. For example, each of the variable capacitance elements C(1,1) to C(32,32) is configured by joining the drains and the sources of the two NMOS transistors. In this case, terminals where the drains and the sources are joined are capacitance control terminals. The variable capacitance elements C(1,1) to C(32,32) are connected in parallel between terminals T1 and T2 of the digitally controlled oscillator 120 (FIG. 2).

The switching elements S(1,1) to S(32,32) are, for example, NMOS transistors. The switching elements S(1,1) to S(32,32) performs an ON/OFF operation according to control signals supplied to gates, respectively. For example, the switching elements S(1,1) to S(32,32) are brought to a conductive state (ON) when the control signal is at an H level (a high voltage), and are brought to a non-conductive state (OFF) when the control signal is at an L level (a low voltage). The control signal at an L level according to the present embodiment corresponds to a first connection signal and the control signal at a H level corresponds to a second connection signal. While being brought to the conductive state (ON) when the control signal is at an H level and being brought to the non-conductive state (OFF) when the control signal is at an L level, the switching elements S(1,1) to S(32,32) according to the present embodiment are not limited thereto. For example, the switching elements S(1,1) to S(32,32) may be configured to be brought to the conductive state (ON) when the control signal is at an L level and to be brought to the non-conductive state (OFF) when the control signal is at an H level. The configurations of the switching elements S(1,1) to S(32,32) are not limited to the NMOS transistors.

The switching elements S(1,n) to S(32,n) are connected in series to a column control line Ltn that is connected to a top control terminal Otn and an opposing bottom control terminal Obn. The capacitance control terminals of the variable capacitance elements C(1,n) to C(32,n) are connected to corresponding one ends of the switching elements S(1,n) to S(32,n), respectively. The first capacitance signal or the second capacitance signal is supplied to the control terminal Otn and the control terminal Obn.

Gates being control terminals of the switching elements S(m,1) to S(m,32) are connected in series to a row control line Lgm connected to a control terminal Ogm. The switching elements S(m,1) to S(m,32) are brought to a conductive state (ON), for example, when a signal on the control terminal Ogm is at an H level and are brought to a non-conductive state (OFF) when the signal is at an L level. In this way, the control terminals of the switching elements S(m,1) to S(m,32) arranged in the corresponding mth row are connected in series to a common row control line Lgm and the first connection signal or the second connection signal is supplied to the row control line Lgm.

As described above, the switching elements S(1,n) to S(32,n) and the variable capacitance elements C(1,n) to C(32,n) are constituted by a column of multi-elements E(1,n) to E(32,n) which are elements E each having a variable capacitance element C and a switching element S arranged in a column. The second element group 130 has columns of the multi-elements E(1,n) to E(32,n) arranged in m columns. Accordingly, the elements E are placed in a matrix including E(1,1) to E(32,32).

This enables the total capacitance of the variable capacitance elements C(1,1) to C(32,32) to be controlled by 32 column control lines Ltn and 32 row control lines Lgm, as described later. Although an individual control line is conventionally connected from the phase-frequency control circuit 118 (FIG. 2) to each of the variable capacitance elements C(1,1) to C(32,32) and n×m (32×32=1024) control lines are required, n+m (32+32=64) control lines suffice and therefore downscaling of the capacitance elements E(1,1) to E(32,32) and reduction of the parasitic capacitance can be achieved. Accordingly, an increase in the number of capacitance elements E(1,1) to E(32,32) in a limited space within a SOI substrate becomes easier. That is, the number of bits of the second element group 130 can be more easily increased in a limited space within a SOI substrate.

Figure 7:
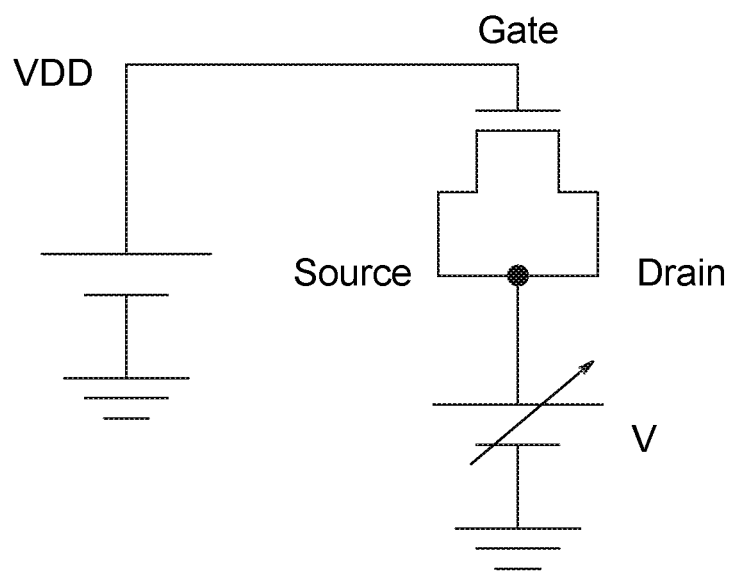
FIG. 7 is a diagram illustrating an equivalent circuit example of an NMOS transistor.
Figure 8:
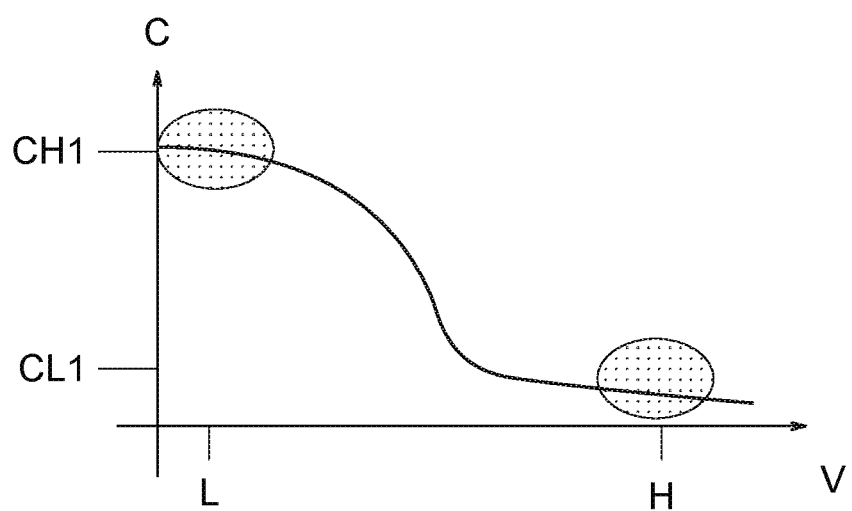
FIG. 8 is a diagram illustrating a relation between a voltage and a capacitance of the NMOS transistor illustrated in FIG. 7.

Characteristics of the NMOS transistors constituting the variable capacitance elements C(1,1) to C(32,32) are explained below with reference to FIGS. 7 and 8. FIG. 7 is a diagram illustrating an equivalent circuit example of a variable capacitance element C where a voltage VDD is applied to a gate (Gate) of an NMOS transistor and a variable voltage V is applied to a source (Source) and a drain (Drain) thereof. FIG. 8 is a diagram illustrating a relation between the voltage and the capacitance of the NMOS transistor illustrated in FIG. 7. The horizontal axis represents the variable voltage V and the vertical axis represents the gate capacitance C of the NMOS transistor.

As illustrated in FIG. 8, the NMOS transistor has a high capacitance value CH1 at a low voltage level L and has a low capacitance value CL1 at a high voltage level H. That is, each of the variable capacitance elements C(1,1) to C(32,32) has a high capacitance when a low voltage L is applied thereto and has a low capacitance when a high voltage H is applied thereto.

That is, each of the variable capacitance elements C(1,1) to C(32,32) has a high capacitance when the first capacitance signal output from the top control terminal Otn or the bottom control terminal Obn corresponds to a low voltage level L and has a low capacitance when the second capacitance signal corresponds to a high voltage level H.

The unit capacitance described above is a difference between the high capacitance and the low capacitance. In this way, the gate capacitance of the NMOS transistor is used as the variable capacitance element C in the present embodiment. Accordingly, the unit capacitance can be freely set by appropriately setting the high voltage level H and the low voltage level L. This enables the frequency change with respect to the unit control signal in the digitally controlled oscillator 120 to be more easily adjusted, for example, by appropriately setting the high voltage level H and the low voltage level L.

Figure 9:
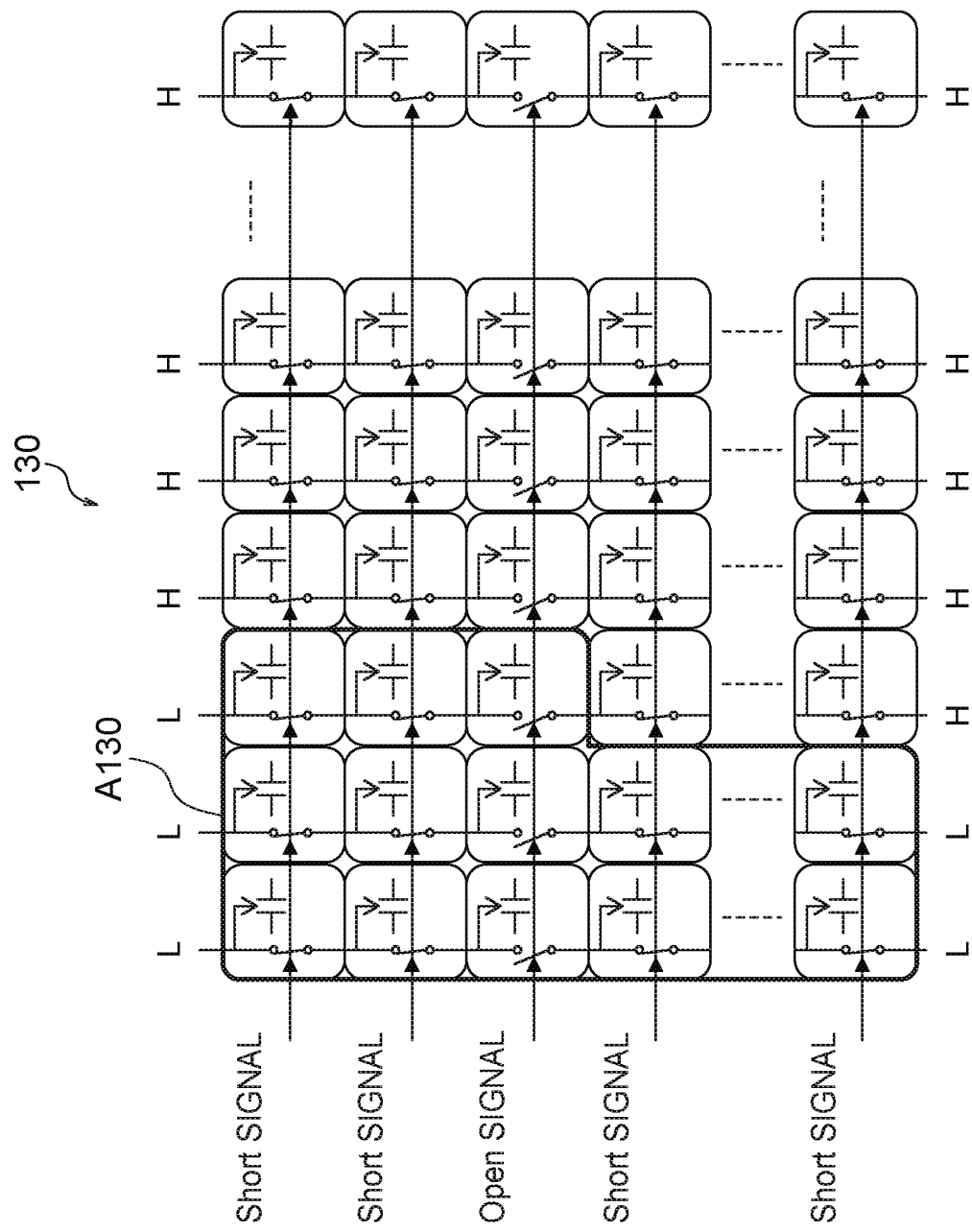
FIG. 9 is a diagram illustrating a range example in which variable capacitance elements have a high capacitance.

Control on the total capacitance of the variable capacitance elements C(1,1) to C(32,32) is explained based on FIG. 9 while referring to FIGS. 5 and 6. FIG. 9 is a diagram illustrating a range example A130 in which the variable capacitance elements C(1,1) to C(32,32) have a high capacitance. In FIG. 9, L denotes the first capacitance signal at the low voltage level L and H denotes the second capacitance signal at the high voltage level H. An Open signal corresponds to the first connection signal that brings the switching elements S(1,1) to S(32,32) to the non-conductive state and a Short signal corresponds to the second connection signal that brings the switching elements S(1,1) to S(32,32) to the conductive state.

As illustrated in FIG. 9, the Open signal (the first connection signal) that brings switching elements to the non-conductive state is output to one control terminal Ogn among the control terminals Og1 to Og32. Meanwhile, the Short signal (the second connection signal) is output to control terminals other than the control terminal Ogn among the control terminals Og1 to Og32.

Accordingly, the switching elements S(n,1) to S(n,32) to which the Open signal is output are brought to the non-conductive state. Therefore, the first capacitance signal (L) and the second capacitance signal (H) are both enabled to be output to each of the control terminals Ot1 to Ot32 and the control terminals Ob1 to Ob32, and either the first capacitance signal (L) or the second capacitance signal (H) is output to the variable capacitance elements C(1,1) to C(32, 32).

In other words, when all the switching elements S(n,1) to S(n,32) are in the conductive state, the control terminals Ot1 to Ot32 and the corresponding control terminal Ob1 to Ob32 have same potentials and therefore only one of the first capacitance signal (L) and the second capacitance signal (H) can be applied. In contrast thereto, because the switching elements S(n,1) to S(n,32) to which the Open signal is output are brought to the non-conductive state in the present embodiment, the control terminal Ot1 to Ot32 and the corresponding control terminals Ob1 to Ob32 can be set to same potentials or different potentials. Accordingly, both the first capacitance signal (L) and the second capacitance signal (H) can be applied to each of the control terminals Ot1 to Ot32 and the control terminals Ob1 to Ob32 as described above.

For example, when only the variable capacitance element C(1,1) is to be brought to a high capacitance and the other variable capacitance elements C are to be brought to low capacitances, the Open signal is output to the control terminal Og1 and the first capacitance signal (L) is output only to the control terminal Ot1. That is, the second capacitance signal (H) is output to control terminals other than the control terminal Ot1 among the control terminals Ot1 to Ot32 and the control terminals Ob1 to Ob32.

Next, when only the variable capacitance elements C(1,1) and C(2,1) are to be brought to high capacitances and the other variable capacitance elements C are to be brought to low capacitances, the Open signal is output to the control terminal Og2 and the first capacitance signal (L) is output only to the control terminal Ot1. When the second capacitance signal (H) is thus output to control terminals other than the control terminal Ot1 among the control terminals Ot1 to Ot32 and the control terminals Ob1 to Ob32, the number of high-capacitance variable capacitance elements C can be increased one by one up to 32 by changing a control terminal Ogn to which the Open signal is output.

When 32 variable capacitance elements C are brought to high capacitances and a 33th variable capacitance element C is to be brought to a high capacitance, the Open signal is output to the control terminal Og1 and the first capacitance signal (L) is output only to the control terminals Ot1, Ob2, and Ot2. By then changing the control terminal Ogn to which the Open signal is output, the number of high-capacitance variable capacitance elements C can be increased one by one from 33 to 64.

When 64 variable capacitance elements C are brought to high capacitances and a 65th variable capacitance element C is to be brought to a high capacitance, the Open signal is output to the control terminal Og1 and the first capacitance signal (L) is output only to the control terminals Ot1, Ob2, Ot2, Ob2, and Ot3. By then changing the control terminal Ogn to which the Open signal is output, the number of high-capacitance variable capacitance elements C can be increased one by one from 65 to 96. Because the Open signal is output to the control terminal Og3 in FIG. 9, 67 variable capacitance elements C are high capacitances and the remaining variable capacitance elements C are low capacitances.

With this processing, the total capacitance value of the variable capacitance elements C(1,1) to C(32,32) can be changed in 32×32 stages. That is, the element group 130 has a variable capacitance of 1024 bits.

Referring back to FIG. 2, details of the fine-adjustment control signal are explained. For example, when N variable capacitance elements C are to be brought to high capacitances, the phase-frequency control circuit 118 of the frequency synthesizer 100 divides 32×32 by N and outputs the first capacitance signal (L) to control terminals Ot1 to Otn and Ob1 to Obn in columns corresponding to the solution n, and outputs the first capacitance signal (L) also to a control terminal Ot(n+1) when the remainder is not 0 (zero). In this case, the Open signal is output to a control terminal Ogm corresponding to the remainder m.

For example, when 67 variable capacitance elements C are to be brought to high capacitances, the phase-frequency control circuit 118 divides 67 by 32. Because the solution is 2 and the remainder is 3, the first capacitance signal (L) is output to the control terminals Ot1 to Ot2, Ob1 to Ob2, and Ot3=Ot(2+1), and the Open signal is output to the control terminal Og3.

For example, when 64 variable capacitance elements C are to be brought to high capacitances, 64 is divided by 32. Because the solution is 2 and the remainder is 0, the first capacitance signal (L) is output to the control terminals Ot1 to Ot2 and Ob1 to Ob2, and the Open signal is output to the control terminal Og32.

For example, the phase-frequency control circuit 118 applies control signals for the control terminals Ot1 to Otn and Ob1 to Obn, and control signals for the control terminals Og1 to Ogn as the fine adjustment control signal to the second element group 130. In this way, the total capacitance value of the variable capacitance elements C(1,1) to C(32, 32) can be changed in 32×32=1024 stages.

Figure 10:
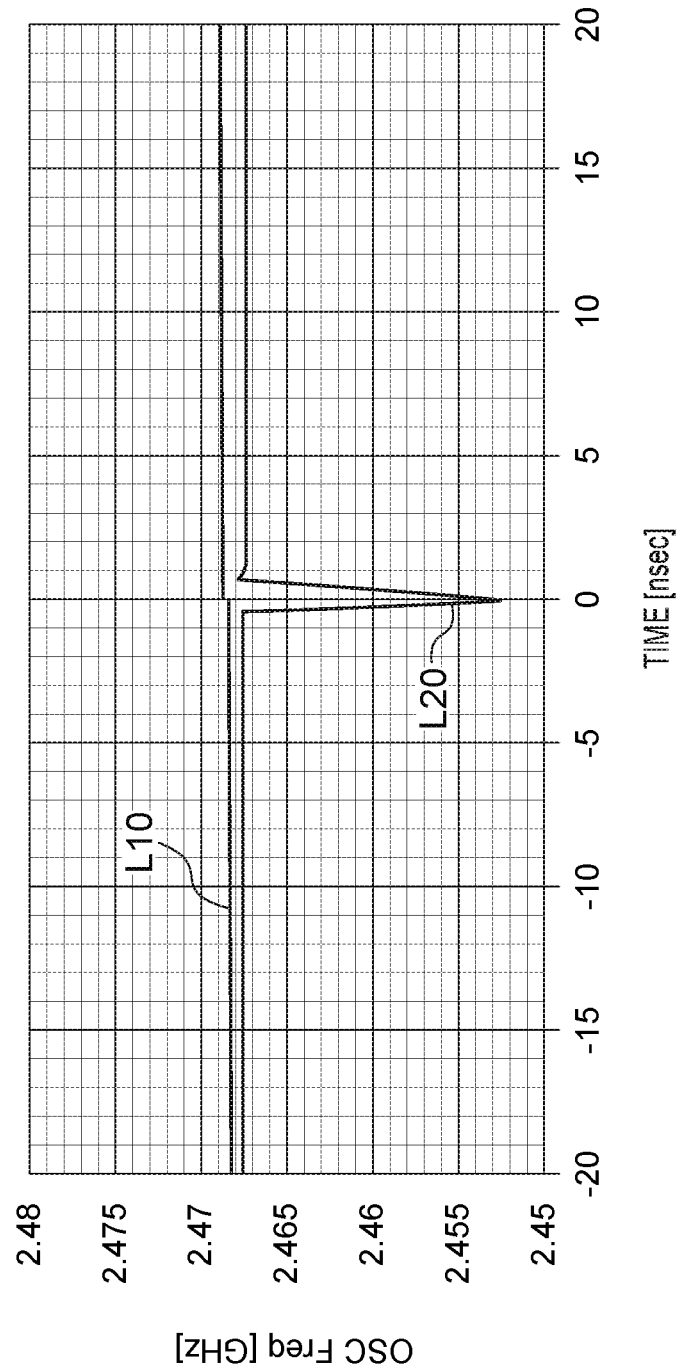
FIG. 10 is a diagram illustrating an example of transient changes of an oscillation frequency of a frequency synthesizer.

FIG. 10 is a diagram illustrating an example of transient changes of the oscillation frequency of the frequency synthesizer 100. The horizontal axis represents a time and the vertical axis represents an oscillation frequency. In FIG. 10, L10 denotes a transient change example of the oscillation frequency of the frequency synthesizer 100 according to the present embodiment and L20 denotes a transient change example of the oscillation frequency of a comparative example. It is assumed that a frequency change point is at a time 0.

The comparative example is an example in which the total capacitance is changed with capacitance elements having different capacitances where N is the base. For example, N as the base is 16 (N=16) and the unit capacitance is 1 fF. Accordingly, 1024 levels can be realized, for example, with 3 capacitance elements of 256 fF, 15 capacitance elements of 16 fF, and 15 capacitance elements of 1 fF. It is assumed here that the capacitance is to be changed from 256 fF to 255 fF. In this case, in the comparative example, it is necessary to switch the capacitance elements of 256 fF from ON to OFF, and simultaneously switch the 15 capacitance elements of 16 fF from OFF to ON and switch the capacitance elements of 1 fF from OFF to ON. However, because the switching is performed in a finite time, it is difficult to simultaneously switch these capacitances in practice. Therefore, the capacitance value inevitably becomes a value larger than 256 fF or a value smaller than 255 fF during the switching of the capacitances. This variation of the capacitance value during the switching becomes a factor of instantaneously bringing the frequency to a large value or a small value as indicated by the line L20.

according to the present embodiment, a change of the total capacitance value of the variable capacitance elements C(1, 1) to C(32,32) can be achieved by changing the capacitance of each of the variable capacitance elements C. Therefore, the operation of interchanging capacitance elements is not required at the time of bit changing and occurrence of a deviation of the oscillation frequency can be suppressed.

While being used in the frequency synthesizer 100, the second element group 130 according to the present embodiment is not limited thereto. The second element group 130 may be used in all electronic devices that require a variable capacitance.

As described above, according to the present embodiment, the second element group 130 is configured to include the variable capacitance elements C(1,n) to C(32,n) where the switching elements S(1,n) to S(32,n) are connected in series to the column control line Ltn located between the column control terminal (Otn) and the column control terminal (Obn), and capacitance control terminals are connected to corresponding one ends of the switching elements S(1,n) to S(32,n), respectively. This enables the first capacitance signal or the second capacitance signal to be supplied to the column control terminal (Otn) and the opposing column control terminal (Obn), and the total capacitance of the variable capacitance elements C(1,n) to C(32,n) can be changed in 32 stages by the column control line Ltn without individually connecting control lines to the variable capacitance elements C(1,n) to C(32,n) from the phase-frequency control circuit 118. With this reduction of the number of control lines, the number of the variable capacitance elements C(1,n) to C(32,n) can be increased in a limited space while the occupation area and the parasitic capacitance of the control lines are suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a plurality of switching elements connected in series between a first control terminal and a second control terminal, where plural types of capacitance control signals can be supplied to the first control terminal and the second control terminal; and
a plurality of variable capacitance elements having capacitance control terminals connected to corresponding one ends of the switching elements, respectively, and are connected in parallel between control terminals,
wherein a first connection signal rendering a non-conductive state is supplied to one switching element among the switching elements connected in series, and a second connection signal rendering a conductive state is supplied to remaining switching elements, and
wherein a first capacitance signal bringing the variable capacitance elements to a first capacitance is supplied to one of the first control terminal and the second control terminal, and a second capacitance signal bringing the variable capacitance elements to a second capacitance different from the first capacitance is supplied to the other control terminal.

2. The device of claim 1, wherein
the switching elements and the variable capacitance elements are constituted by a column of multi-elements being elements each comprising the variable capacitance element and the switching element arranged in a column, and
a plurality of the columns of multi-elements are placed to arrange the elements in a matrix.

3. The device of claim 2, wherein control terminals of a plurality of switching elements arranged in corresponding rows are connected in series to common control lines, respectively, and the first connection signal or the second connection signal is supplied to the control lines.

4. The device of claim 1, wherein the variable capacitance elements are gate capacitances of N-channel metal oxide semiconductor (NMOS) transistors.

5. The device of claim 1, wherein the switching elements are transistors.

6. The device of claim 1, wherein the variable capacitance elements are connected in parallel.

7. A digitally controlled oscillator comprising:
a plurality of switching elements connected in series between a first control terminal and a second control terminal, where plural types of capacitance control signals can be supplied to the first control terminal and the second control terminal; and
a plurality of variable capacitance elements having capacitance control terminals connected to corresponding one ends of the switching elements, respectively, and are connected in parallel between control terminals,
wherein an oscillation frequency changes according to a total capacitance value of the variable capacitance elements,
wherein a first connection signal rendering a non-conductive state is supplied to one switching element among the switching elements connected in series, and a second connection signal rendering a conductive state is supplied to remaining switching elements connected in series, and
wherein a first capacitance signal bringing the variable capacitance elements to a first capacitance is supplied to one of the first control terminal and the second control terminal, and a second capacitance signal bringing the variable capacitance elements to a second capacitance different from the first capacitance is supplied to the other control terminal.

8. The oscillator of claim 7, wherein
the switching elements and the variable capacitance elements are constituted by a column of multi-elements being elements each comprising the variable capacitance element and the switching element arranged in a column, and
a plurality of the columns of multi-elements are placed to arrange the elements in a matrix.

9. The oscillator of claim 8, wherein control terminals of a plurality of switching elements arranged in corresponding rows are connected in series to common control lines, respectively, and the first connection signal or the second connection signal is supplied to the control lines.

10. The oscillator of claim 7, wherein the variable capacitance elements are gate capacitances of NMOS transistors.

11. The oscillator of claim 7, wherein the switching elements are transistors.

12. The oscillator of claim 7, wherein the variable capacitance elements are connected in parallel.

13. A control method of a semiconductor device comprising a plurality of switching elements connected in series between a first control terminal and a second control terminal, where plural types of capacitance control signals can be supplied to the first control terminal and the second control terminal, and a plurality of variable capacitance elements having capacitance control terminals connected to corresponding one ends of the switching elements, respectively, and are connected in parallel between control terminals, the method comprising:

bringing at least one of the switching elements connected in series to a non-conductive state; and supplying a first capacitance signal bringing the variable capacitance elements to a first capacitance to one of the first control terminal and the second control terminal, and supplying a second capacitance signal bringing the variable capacitance elements to a second capacitance different from the first capacitance to the other control terminal, wherein a first capacitance signal bringing the variable capacitance elements to a first capacitance is supplied to one of the first control terminal and the second control terminal, and a second capacitance signal bringing the variable capacitance elements to a second capacitance different from the first capacitance is supplied to the other control terminal.

14. The method of claim 13, wherein the switching elements and the variable capacitance elements are constituted by a column of multi-elements being elements each comprising the variable capacitance element and the switching element arranged in a column, and a plurality of the columns of multi-elements are placed to arrange the elements in a matrix.

15. The method of claim 14, wherein control terminals of a plurality of switching elements arranged in corresponding rows are connected in series to common control lines, respectively, and the first connection signal or the second connection signal is supplied to the control lines.

* * * * *